(12) United States Patent
Tachibana

(10) Patent No.: US 11,228,080 B2
(45) Date of Patent: Jan. 18, 2022

(54) DIELECTRIC FILTER AND METHOD FOR MANUFACTURING THE SAME

(71) Applicant: DUPONT ELECTRONICS, INC., Wilmington, DE (US)

(72) Inventor: Yusuke Tachibana, Kanagawa (JP)

(73) Assignee: DUPONT ELECTRONICS, INC., Wilmington, DE (US)

( * ) Notice: Subject to any disclaimer, the term of this patent is extended or adjusted under 35 U.S.C. 154(b) by 38 days.

(21) Appl. No.: 16/674,133

(22) Filed: Nov. 5, 2019

(65) Prior Publication Data

US 2020/0144691 A1    May 7, 2020

Related U.S. Application Data

(60) Provisional application No. 62/756,856, filed on Nov. 7, 2018.

(51) Int. Cl.
*H01P 7/10* (2006.01)
*H01P 1/208* (2006.01)
*H05K 3/46* (2006.01)

(52) U.S. Cl.
CPC ............. *H01P 7/10* (2013.01); *H01P 1/2084* (2013.01); *H05K 3/4623* (2013.01)

(58) Field of Classification Search
CPC ........ H01P 7/10; H01P 1/2084; H05K 3/4623
See application file for complete search history.

(56) References Cited

U.S. PATENT DOCUMENTS 5,089,172 A * 2/1992 Allison .................. C03C 3/066
                                                                                    252/512

FOREIGN PATENT DOCUMENTS

EP          2940783 A1    11/2015
WO     2009/006242 A1     1/2009

* cited by examiner

*Primary Examiner* — Samuel S Outten
(74) *Attorney, Agent, or Firm* — Hong Xu

(57) ABSTRACT

The invention relates to a method of manufacturing a dielectric filter. The method comprises the steps of: (a) preparing a ceramic substrate; (b) applying a conductive paste on the ceramic substrate, wherein the conductive paste comprises, (i) 100 parts by weight of a conductive powder, (ii) 0.1 to 10.0 parts by weight of a glass frit comprising silicon oxide, boron oxide, aluminum oxide and an alkaline metal oxide, and (iii) an organic vehicle; and (c) firing the applied conductive paste.

10 Claims, 1 Drawing Sheet

DIELECTRIC FILTER AND METHOD FOR MANUFACTURING THE SAME

FIELD OF INVENTION

The present invention relates to an electrical component, particularly to an electrode on a ceramic substrate and an electrical component comprising thereof. More particularly, the present invention relates to dielectric filter suitable for radio frequency.

TECHNICAL BACKGROUND OF THE INVENTION

An electrode on a ceramic substrate of dielectric filter needs to contribute to better performance of the electrical component.

WO2009006242 discloses a conductive paste for a ceramic substrate of alumina or aluminum nitride. The conductive paste comprises a) a conductive metal powder comprising silver and palladium, b) a $Bi_2O_3$—$SiO_2$—$B_2O_3$ glass powder and c) an organic solvent, wherein the conductive metal powder has an average particle diameter of not more than 1.2 μm.

EP2940783 disclose a transverse electromagnetic (TEM) mode dielectric filter, wherein the TEM mode dielectric filter comprises a dielectric body and a silver plating layer, wherein the silver plating layer covers a surface of the dielectric body, and a dielectric constant of the dielectric body is less than or equal to 21.

SUMMARY OF THE INVENTION

An objective is to provide a dielectric filter having a better performance.

An aspect relates to a method of manufacturing a dielectric filter, comprising the steps of: (a) preparing a ceramic substrate; (b) applying a conductive paste on the ceramic substrate, wherein the conductive paste comprises, (i) 100 parts by weight of a conductive powder, (ii) 0.1 to 10.0 parts by weight of a glass frit comprising silicon oxide, boron oxide, aluminum oxide and an alkaline metal oxide, and (iii) an organic vehicle; and (c) firing the applied conductive paste.

Another aspect relates to a conductive paste to form an electrode of dielectric filter, wherein the conductive paste comprises: (i) 100 parts by weight of a conductive powder, (ii) 0.1 to 10.0 parts by weight of a glass frit comprising silicon oxide, boron oxide, aluminum oxide and an alkaline metal oxide, and (iii) an organic vehicle.

Another aspect relates to dielectric filter comprising a ceramic substrate and an electrode on the ceramic substrate, the electrode comprises (i) 100 parts by weight of a conductive powder, and (ii) 0.1 to 10.0 parts by weight of a glass frit comprising silicon oxide, boron oxide, aluminum oxide and an alkaline metal oxide.

Dielectric filters of the present invention have better performance such as Q value.

DESCRIPTION OF THE PREFERRED EMBODIMENTS

Figure 1:
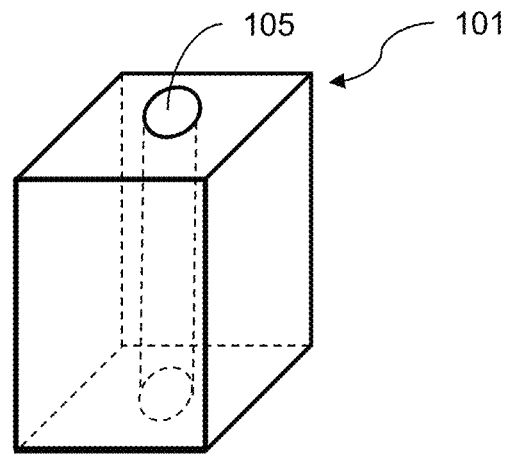
FIG. 1 depicts one embodiment of a ceramic substrate.

The method of manufacturing an electrode comprising the steps of: (a) preparing a ceramic substrate, (b) applying a conductive paste on the ceramic substrate, and (c) firing the applied conductive paste.

The ceramic substrate has a dielectric constant, $\varepsilon_\gamma$, of 9 to 50 in an embodiment. The ceramic substrate contains a dielectric constant of 15 to 45 in an embodiment, and 20 to 40 in another embodiment. Dielectric constant of the ceramic substrate can be measured by a known method or by a commercial measurement equipment. In an embodiment, dielectric constant is measured by the method of ASTM Standard D2520 at 5 GHz. Such ceramic substrates are suitable for ceramic filters used in radio frequency. More specifically, the ceramic substrates are suitable for ceramic filters used in 1 GHz to 10 GHz.

Ceramic substrate compositions are described herein as including certain metal oxide components. Specifically, the metal oxide components are the components used as the starting material that is subsequently processed to form a ceramic substrate. Such nomenclature is conventional to one of skill in the art. As recognized by one of ordinary skill in the art in ceramic chemistry, a certain portion of oxygen may be released during the process of making the ceramic substrate.

Metal components of the ceramic substrate are selected from the group consisting of Al, Ba, Ca, La, Mg, Mn, Nb, Nd, Ni, Pb, Sm, Sn, Sr, Ta, Ti, Zn, Zr and a mixture thereof. 60 mol %, 70 mol %, 80 mol %, 90 mol % or 100 mol % of metal components of the ceramic substrate is composed of the above metal or a mixture in an embodiment. In an embodiment, other metal(s) are included as metal component of the ceramic substrate.

The ceramic substrate include, but not limited to, $Al_2O_3$ ($\varepsilon_\gamma=9$), $BaTi_4O_9$ ($\varepsilon_\gamma=38$), $Ba_2Ti_9O_{20}$ ($\varepsilon_\gamma=37$), $BaSnO_3$, $BaMgO_3$, $BaTaO_3$, $BaZnO_3$, $BaZrO_3$, $Ba(ZrTi)O_3$, $Ba(Ni-Ta)O_3$, $Ba(ZrZnTa)O_3$, $Ba(Mg_{1/3}Ta_{2/3})O_3$ ($\varepsilon_\gamma=25$), $Ba(Mg_{1/3}Nb_{2/3})O_3$, $Ba(Zn_{1/3}Ta_{2/3})O_3$ ($\varepsilon_\gamma=30$), $Ba(Zn_{1/3}Nb_{2/3})O_3$ ($\varepsilon_\gamma=41$), $Ba(Mn_{1/3}Ta_{2/3})O_{O3}$, $CaTiO_3$, $(CaSrBa)ZrO_3$, $MgTiO_3$, $(Mg_{0.95}Ca_{0.05})TiO_3$ ($\varepsilon_\gamma=21$), $SnTiO_4$, $SrTiO_3$, $SrZrO_3$, $Sr(Zn_{1/3}Nb_{2/3})O_3$, $Sr(Zn_{1/3}Ta_{2/3})O_3$, $ZrTiO_2$, $(Zr_{0.8}Sn_{0.2})TiO_4$ ($\varepsilon_\gamma=38$), $ZrTiO_2$ ($\varepsilon_\gamma=42$) and a mixture thereof. In an embodiment, the ceramic substrate is selected from the group consisting of $Al_2O_3$, $MgTiO_3$, $(Mg_{0.95}Ca_{0.05})TiO_3$, $Ba(Mg_{1/3}Ta_{2/3})O3$, $BaTi_4O_9$, $Ba_2Ti_9O_{20}$, $Ba(Zn_{1/3}Ta_{2/3})O_3$ and $Ba(Zn_{1/3}Nb_{2/3})O_3$, $(Zr_{0.8}Sn_{0.2})TiO_4$. Any other known ceramic substrate or newly developed ceramic substrate may be used.

The ceramic substrate is 500 μm thick or more in another embodiment, 1 mm thick or more in another embodiment, 1.8 mm thick or more in another embodiment. The ceramic substrate is 100 mm thick or less in an embodiment, 60 mm thick or less in another embodiment, 45 mm thick or less in another embodiment, 20 mm thick or less in another embodiment, 12 mm thick or less in another embodiment, 7 mm thick or less in another embodiment.

Surface treatment is applied for the ceramic substrate in an embodiment. A smoothing treatment or a roughening treatment is applied on the surface of the substrate in an embodiment. A primer layer is formed on the surface of the ceramic substrate in an embodiment. The primer layer is formed by chemical vapor deposition in an embodiment. The primer layer is formed by plating in another embodiment.

The ceramic substrate is TEM (transverse electromagnetic) mode dielectric filter in an embodiment. High Q value rendered by the conductive paste is more effective in TEM mode dielectric filter. The ceramic substrate is TM (transverse magnetic) mode dielectric filter in another embodiment.

A conductive paste is applied on the ceramic substrate. The conductive paste is applied by screen-printing, spraying or dipping in an embodiment. The conductive paste is applied by screen-printing in another embodiment. The conductive paste is applied by spraying in another embodiment. The conductive paste is applied by dipping the ceramic substrate into the conductive paste in another embodiment.

The conductive paste is applied on the entire surface of the ceramic substrate in an embodiment. In case of TEM (transverse electromagnetic) mode dielectric filter, the entire surface of the ceramic substrate is covered with the conductive layer made from the conductive paste in an embodiment, at least 90%, 95%, 98% or 99% of the ceramic substrate is covered with the conductive layer in an embodiment.

The conductive paste viscosity can be adjusted to be suitable for the applying method such as screen-printing, spraying or dipping. Viscosity of the conductive paste is 0.5 to 550 Pa·s in an embodiment, 1 to 500 Pa·s in another embodiment, 5 to 450 Pa·s in another embodiment, 10 to 400 Pa·s in another embodiment measured by Brookfield HBT with a spindle SC4-14 at 10 rpm or ½RVT with a spindle RV3 at 10 rpm.

The applied conductive paste is 5 to 40 µm thick in an embodiment, 7 to 30 µm thick in an embodiment, 10 to 20 µm thick in another embodiment.

The applied conductive paste is optionally dried before firing step in an embodiment. The drying condition is 50 to 250° C. for 3 to 30 minutes in an embodiment.

The applied conductive paste is fired to become an electrode. The firing peak temperature is 600 to 1100° C. in an embodiment, 650 to 1050° C. in another embodiment, 800 to 1000° C. in another embodiment. Firing time at the peak temperature is 3 to 30 minutes in an embodiment, 5 to 20 minutes in another embodiment, 7 to 15 minutes in another embodiment.

The electrical component is used in radio frequency. More specifically, the ceramic substrates are suitable for ceramic filters used in 1 GHz to 10 GHz.

Figure 2:
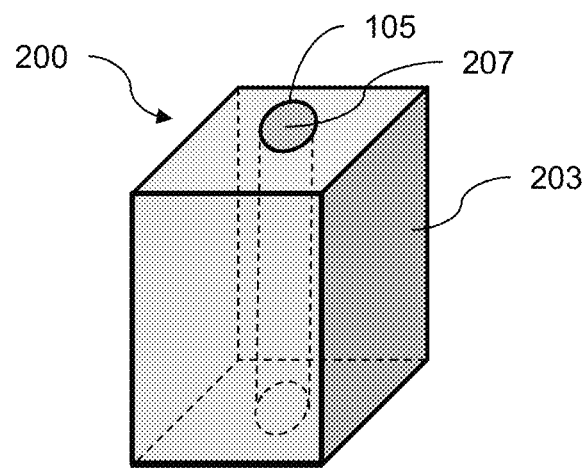
FIG. 2 depicts one embodiment of a resonator.

One embodiment of a filter is illustrated in FIG. 1 and FIG. 2. The ceramic substrate 101 comprising a hole 105 is prepared (FIG. 1). An external electrode 203 is formed on the outer surface of the ceramic substrate (FIG. 2). An internal electrode 207 is formed on the internal wall of the hole 105. The conductive paste is applied by spraying or dipping to form the internal electrode 207 and by spraying, dipping or screen printing to form the external electrode 203 in an embodiment. The resonator 200 comprises a ceramic substrate 101 comprising a hole 105 and an external electrode 203 on the outer surface of the ceramic substrate and an internal electrode 207 on the internal wall of the hole in an embodiment.

Typically, multiple resonators are placed to form a dielectric filter. In an embodiment, a single resonator is used as a dielectric filter. Such resonator composed of a single resonator is encompassed as dielectric filter in this specification.

Figure 3:
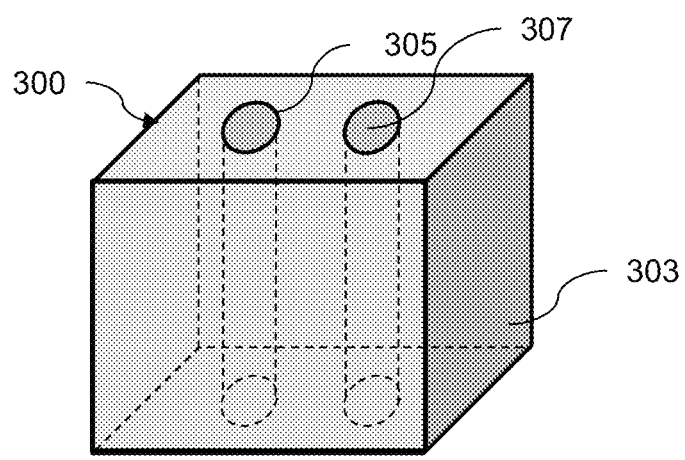
FIG. 3 depicts one embodiment of a filter.

One embodiment of a dielectric filter 300 is illustrated in FIG. 3. The dielectric filter 300 comprises a ceramic substrate and an external electrode 303 on the outer surface of the ceramic substrate. The ceramic substrate comprises two holes 305 in an embodiment. Internal electrodes 307 are formed inside the internal wall of each hole 305. The dielectric filter comprises at least one hole in another embodiment. The dielectric filter 300 comprises a ceramic substrate comprising at least one hole and an external electrode 303 on the outer surface of the ceramic substrate and an internal electrode 307 on the internal wall of the hole 305 in an embodiment.

The internal electrode is 5 to 40 µm thick in an embodiment, 7 to 30 µm thick in an embodiment, 10 to 20 µm thick in another embodiment.

The external electrode is 5 to 40 µm thick in an embodiment, 7 to 30 µm thick in an embodiment, 10 to 20 µm thick in another embodiment.

The conductive paste to form an electrode is explained hereafter. The conductive paste comprises, (i) 100 parts by weight of a conductive powder, (ii) 0.1 to 10 parts by weight of a glass frit and (iii) an organic vehicle.

(i) Conductive Powder

A conductive powder is a powder to provide the electrode with electrically conductivity. A conductive powder is a metal powder with electrical conductivity of $7.00 \times 10^6$ Siemens (S)/m or higher at 293 Kelvin in an embodiment, $8.50 \times 10^6$ S/m or higher at 293 Kelvin in another embodiment, $1.00 \times 10^7$ S/m or higher at 293 Kelvin in another embodiment, $4.00 \times 10^7$ S/m or higher at 293 Kelvin in another embodiment.

The conductive powder can be a metal powder selected from the group consisting of aluminum (Al, $3.64 \times 10^7$ S/m), nickel (Ni, $1.45 \times 10^7$ S/m), copper (Cu, $5.81 \times 10^7$ S/m), silver (Ag, $6.17 \times 10^7$ S/m), gold (Au, $4.17 \times 10^7$ S/m), molybdenum (Mo, $2.10 \times 10^7$ S/m), magnesium (Mg, $2.30 \times 10^7$ S/m), tungsten (W, $1.82 \times 10^7$ S/m), cobalt (Co, $1.46 \times 10^7$ S/m), zinc (Zn, $1.64 \times 10^7$ S/m), platinum (Pt, $9.43 \times 10^6$ S/m), palladium (Pd, $9.5 \times 10^6$ S/m), an alloy thereof and a mixture thereof in an embodiment. The conductive powder can be selected from the group consisting of silver, gold, copper, an alloy thereof and a mixture thereof in another embodiment. The conductive powder comprises silver in another embodiment. The conductive powder comprises palladium less than 0.1 wt. % in an embodiment, less than 0.09 wt. % in another embodiment, less than 0.06 wt. % in another embodiment, less than 0.03 wt. % in another embodiment based on the weight of the conductive powder. The conductive powder comprises no palladium in another embodiment.

Particle diameter (D50) of the conductive powder is 0.01 to 10 µm in an embodiment, 0.1 to 5 µm in another embodiment, 0.2 to 3.1 µm in another embodiment, and 0.3 to 1.9 µm in another embodiment. The particle diameter (D50) can be measured by laser diffraction scattering method with Microtrac model S-3500.

Specific surface area (SA) of the conductive powder is 0.1 to 8 $m^2/g$ in an embodiment, 0.3 to 6.9 $m^2/g$ in another embodiment and 0.5 to 4.0 $m^2/g$ in another embodiment. The specific surface area can be measured by BET method with a device Monosorb™ from Quantachrome Instruments Corporation.

The conductive powder is 40 to 92 weight percent (wt. %) in an embodiment, 52 to 90 wt. % in another embodiment, 65 to 88 wt. % in another embodiment, 78 to 86 wt. % in another embodiment, based on the weight of the conductive paste.

(ii) Glass Frit

The glass frit functions to render adhesion of the electrodes to the substrate.

The glass frit comprises silicon oxide, boron oxide, aluminum oxide and an alkaline metal oxide.

Silicon oxide is 30 to 85 wt. % in an embodiment, 48 to 83 wt. % in another embodiment, 52 to 81 wt. % in another embodiment, 57 to 79 wt. % in another embodiment, 60 to 77 wt. % in another embodiment, 62 to 75 wt. % in another embodiment, based on the weight of the glass frit.

Boron oxide is 11 to 50 wt. % in an embodiment, 13 to 36 wt. % in another embodiment, 15 to 34 wt. % in another embodiment, 17 to 31 wt. % in another embodiment, 19 to 29 wt. % in another embodiment, 21 to 27 wt. % in another embodiment, based on the weight of the glass frit.

Aluminum oxide is 0.1 to 5.0 wt. % in an embodiment, 0.2 to 4.6 wt. % in another embodiment, 0.4 to 4.0 wt. % in another embodiment, 0.5 to 3.4 wt. % in another embodiment, 0.6 to 2.8 wt. % in another embodiment, 0.7 to 2.2 wt. % in another embodiment, 0.8 to 1.8 wt. % in another embodiment, based on the weight of the glass frit.

Silicon oxide is $SiO_2$ in an embodiment. Boron oxide is $B_2O_3$ in an embodiment. Aluminum oxide is $Al_2O_3$ an embodiment.

The alkaline metal oxide is 0.5 to 6 wt. % in an embodiment, 0.9 to 5.1 wt. % in another embodiment, 1.2 to 4.2 wt. % in another embodiment, 1.4 to 3.6 wt. % in another embodiment, 1.6 to 2.9 wt. % in another embodiment, 1.8 to 2.2 wt. % in another embodiment, based on the weight of the glass frit.

The alkaline metal oxide is selected from the group consisting of lithium oxide, sodium oxide, potassium oxide and a combination thereof in an embodiment.

Lithium oxide is 0.1 wt. % or more in an embodiment, 0.2 wt. % or more in another embodiment, 0.3 wt. % or more in another embodiment, 0.4 wt. % or more in another embodiment, based on the weight of the glass frit. Lithium oxide is 6.0 wt. % or less in an embodiment, 5.2 wt. % or less in another embodiment, 4.3 wt. % or less in another embodiment, 3.5 wt. % or less in another embodiment, 2.8 wt. % or less in another embodiment, 1.6 wt. % or less in another embodiment, 0.9 wt. % or less in another embodiment, based on the weight of the glass frit.

Sodium oxide is 0.1 wt. % or more in an embodiment, 0.2 wt. % or more in another embodiment, 0.3 wt. % or more in another embodiment, 0.4 wt. % or more in another embodiment, based on the weight of the glass frit. Sodium oxide is 6.0 wt. % or less in an embodiment, 5.2 wt. % or less in another embodiment, 4.3 wt. % or less in another embodiment, 3.5 wt. % or less in another embodiment, 2.8 wt. % or less in another embodiment, 1.6 wt. % or less in another embodiment, 0.9 wt. % or less in another embodiment, based on the weight of the glass frit.

Potassium oxide is 0.1 wt. % or more in an embodiment, 0.3 wt. % or more in another embodiment, 0.5 wt. % or more in another embodiment, 0.7 wt. % or more in another embodiment, 0.8 wt. % or more in another embodiment, based on the weight of the glass frit. Potassium oxide is 6.0 wt. % or less in an embodiment, 5.2 wt. % or less in another embodiment, 4.6 wt. % or less in another embodiment, 3.8 wt. % or less in another embodiment, 3.0 wt. % or less in another embodiment, 2.1 wt. % or less in another embodiment, 1.5 wt. % or less in another embodiment, based on the weight of the glass frit.

The alkaline metal oxide comprises lithium oxide, sodium oxide and potassium oxide in another embodiment. Lithium oxide is $Li_2O$ in an embodiment. Sodium oxide is $Na_2O$ in an embodiment. Potassium oxide is $K_2O$ in an embodiment.

The glass frit further comprises an additional metal oxide selected from the group consisting of zirconium oxide, titanium oxide, calcium oxide, zinc oxide, magnesium oxide, copper oxide, iron oxide and a combination thereof in an embodiment. The additional metal oxide is selected from the group consisting of zirconium oxide, titanium oxide, zinc oxide, copper oxide, iron oxide and a combination thereof in another embodiment.

The additional metal oxide is 0.5 to 20 wt. % in an embodiment, 0.8 to 18 wt. % in another embodiment, 1.0 to 15 wt. % in another embodiment, 1.5 to 12 wt. % in another embodiment, 1.9 to 10 wt. % in another embodiment, 2.2 to 8.5 wt. % in another embodiment, 3.1 to 4.5 wt. % in another embodiment, based on the weight of the glass frit.

Zirconium oxide is 1.0 wt. % or more in an embodiment, 1.4 wt. % or more in another embodiment, 1.6 wt. % or more in another embodiment, 2.0 wt. % or more in another embodiment, based on the weight of the glass frit.

Zirconium oxide is 10 wt. % or less in an embodiment, 8.8 wt. % or less in another embodiment, 7.9 wt. % or less in another embodiment, 7.1 wt. % or less in another embodiment, 6.2 wt. % or less in another embodiment, 4.2 wt. % or less in another embodiment, 3.0 wt. % or less in another embodiment, based on the weight of the glass frit.

Titanium oxide is 1.0 wt. % or more in an embodiment, 1.8 wt. % or more in another embodiment, 2.6 wt. % or more in another embodiment, 3.5 wt. % or more in another embodiment, based on the weight of the glass frit. Titanium oxide is 15 wt. % or less in an embodiment, 13.8 wt. % or less in another embodiment, 12.5 wt. % or less in another embodiment, 11.1 wt. % or less in another embodiment, 9.5 wt. % or less in another embodiment, 8.5 wt. % or less in another embodiment, based on the weight of the glass frit.

Calcium oxide is 1.0 wt. % or more in an embodiment, 1.4 wt. % or more in another embodiment, 1.6 wt. % or more in another embodiment, 2.2 wt. % or more in another embodiment, based on the weight of the glass frit. Calcium oxide is 10 wt. % or less in an embodiment, 8.8 wt. % or less in another embodiment, 7.9 wt. % or less in another embodiment, 7.1 wt. % or less in another embodiment, 6.2 wt. % or less in another embodiment, 4.2 wt. % or less in another embodiment, 3.5 wt. % or less in another embodiment, based on the weight of the glass frit.

Zinc oxide is 1.0 wt. % or more in an embodiment, 1.8 wt. % or more in another embodiment, 2.6 wt. % or more in another embodiment, 3.5 wt. % or more in another embodiment, 5.5 wt. % or more in another embodiment, based on the weight of the glass frit. ZnO is 15 wt. % or less in an embodiment, 13.8 wt. % or less in another embodiment, 12.5 wt. % or less in another embodiment, 11.1 wt. % or less in another embodiment, 9.5 wt. % or less in another embodiment, 8.5 wt. % or less in another embodiment, based on the weight of the glass frit.

Magnesium oxide is 1.0 wt. % or more in an embodiment, 1.4 wt. % or more in another embodiment, 1.6 wt. % or more in another embodiment, 1.8 wt. % or more in another embodiment, based on the weight of the glass frit. Magnesium oxide is 10 wt. % or less in an embodiment, 8.7 wt. % or less in another embodiment, 6.8 wt. % or less in another embodiment, 5.5 wt. % or less in another embodiment, 4.9 wt. % or less in another embodiment, 3.9 wt. % or less in another embodiment, based on the weight of the glass frit.

Copper oxide is 1.0 wt. % or more in an embodiment, 1.8 wt. % or more in another embodiment, 2.6 wt. % or more in another embodiment, 3.1 wt. % or more in another embodiment, based on the weight of the glass frit. Copper oxide is 10 wt. % or less in an embodiment, 8.2 wt. % or less in another embodiment, 6.5 wt. % or less in another embodiment, 5.5 wt. % or less in another embodiment, 4.9 wt. % or less in another embodiment, based on the weight of the glass frit.

Iron oxide is 1.0 wt. % or more in an embodiment, 1.8 wt. % or more in another embodiment, 2.6 wt. % or more in another embodiment, 3.3 wt. % or more in another embodiment, based on the weight of the glass frit. Iron oxide is 10 wt. % or less in an embodiment, 8.2 wt. % or less in another embodiment, 6.5 wt. % or less in another embodiment, 5.3 wt. % or less in another embodiment, 4.3 wt. % or less in another embodiment, based on the weight of the glass frit.

Zirconium oxide is $ZrO_2$ in an embodiment. Titanium oxide is $TiO_2$ in an embodiment. Calcium oxide is CaO in an embodiment. Zinc oxide is ZnO in an embodiment. Magnesium oxide is MgO in an embodiment. Copper oxide is CuO or $Cu_2O$ in an embodiment. Iron oxide is FeO or $Fe_2O_3$ in an embodiment. The additional metal oxide is selected from the group consisting of $ZrO_2$, $TiO_2$, ZnO, CuO, $Fe_2O_3$ and a combination thereof in another embodiment. The additional metal oxide is selected from the group consisting of ZnO, CuO, $Fe_2O_3$ and a combination thereof in another embodiment. The additional metal oxide comprises ZnO in another embodiment. The additional metal oxide comprises CuO in another embodiment. The additional metal oxide comprises $Fe_2O_3$ in another embodiment.

The glass frit may further comprise bismuth oxide ($Bi_2O_3$) but not more than 20 wt. % based on the weight of the glass frit in an embodiment. Bismuth oxide is 15 wt. % or less in another embodiment, 10 wt. % or less in another embodiment, 7 wt. % or less in another embodiment, 3 wt. % or less in another embodiment based on the weight of the glass frit. The glass frit comprises no $Bi_2O_3$ in another embodiment.

Glass compositions, also termed glass frits, are described herein as including percentages of certain components. Specifically, the percentages are the percentages of the components used in the starting material that was subsequently processed as described herein to form a glass composition. Such nomenclature is conventional to one of skill in the art. In other words, the composition contains certain components, and the percentages of those components are expressed as a percentage of the corresponding oxide form. As recognized by one of ordinary skill in the art in glass chemistry, a certain portion of oxygen may be released during the process of making the glass.

The softening point of the glass frit is 450 to 900° C. in an embodiment, 550 to 885° C. in another embodiment, 690 to 870° C. in another embodiment, 730 to 855° C. in another embodiment, 765 to 810° C. in another embodiment.

Particle diameter (D50) of the glass frit is 0.1 to 15 μm in an embodiment, 0.5 to 11 μm in another embodiment, 1.0 to 6.8 μm in another embodiment, and 1.5 to 4.5 μm in another embodiment. The particle diameter (D50) can be measured by laser diffraction scattering method with Microtrac model S-3500.

The glass frit is 0.1 parts by weight or more in an embodiment, 0.2 parts by weight or more in another embodiment, 0.3 parts by weight or more in another embodiment, 0.4 parts by weight or more in another embodiment against 100 parts by weight of the conductive powder. The glass frit is 10.0 parts by weight or less in an embodiment, 7.5 parts by weight or less in another embodiment, 5.5 parts by weight or less in another embodiment, 3.9 parts by weight or less in another embodiment, 2.7 parts by weight or less in another embodiment, 1.8 parts by weight or less in another embodiment, 0.9 parts by weight or less in another embodiment against 100 parts by weight of the conductive powder.

The glass frit is 0.05 wt. % or more in an embodiment, 0.1 wt. % or more in an embodiment, 0.2 wt. % or more in another embodiment based on the weight of the conductive paste. The glass frit is 5.0 wt. % or less in an embodiment, 3.8 wt. % or less in another embodiment, 2.5 wt. % or less in another embodiment, 1.0 wt. % or less in another embodiment based on the weight of the conductive paste.

(iii) Organic Vehicle

The conductive powder and the glass frit are dispersed in an organic vehicle to form a "paste" having suitable viscosity for applying on a substrate.

The organic vehicle comprises an organic polymer and a solvent in an embodiment. A wide variety of inert viscous materials can be used as an organic polymer. The organic polymer can be selected from the group consisting of ethyl cellulose, ethylhydroxyethyl cellulose, wood rosin, phenolic resin, polymethacrylate of lower alcohol, monobutyl ether of ethylene glycol monoacetate and a mixture thereof. The organic polymer is 0.1 to 50 wt. % in an embodiment, 0.5 to 42 wt. % in another embodiment, 1 to 35 wt. % in another embodiment, 2 to 27 wt. % in another embodiment and 3 to 15 wt. % in another embodiment based on the weight of the organic vehicle.

The solvent can be selected from the group consisting of texanol, ester alcohol, terpineol, kerosene, dibutylphthalate, butyl carbitol, butyl carbitol acetate, dibutyl carbitol, hexylene glycol, dibasic ester and a mixture thereof. The solvent is chosen in view of organic polymer solubility. The organic vehicle comprises a mixture of ethyl cellulose and texanol in an embodiment.

The organic vehicle optionally comprises an organic additive. The organic additive can be one or more of a thickener, stabilizer, viscosity modifier, surfactant and thixotropic agent in an embodiment. The amount of the organic additive depends on the desired characteristics of the resulting electrically conductive paste.

The organic vehicle is 5 parts by weight or more in an embodiment, 8 parts by weight or more in another embodiment, 11 parts by weight or more in another embodiment, 15 parts by weight or more in another embodiment against 100 parts by weight of the conductive powder. The organic vehicle is 60 parts by weight or less in an embodiment, 45 parts by weight or less in another embodiment, 39 parts by weight or less in another embodiment, 31 parts by weight or less in another embodiment, 25 parts by weight or less in another embodiment against 100 parts by weight of the conductive powder.

The organic vehicle is 4 to 58 wt. %, 8 to 37 wt. % in another embodiment, and 12 to 23 wt. % in another embodiment based on the weight of the conductive paste. The solvent amount can be adjusted to get desired viscosity of the conductive paste.

(iv) Inorganic Additive

The conductive paste may further comprise an inorganic additive in an embodiment. The inorganic additive could improve adhesion or solderability. The inorganic additive comprises a metal oxide powder selected from the group consisting of copper oxide (CuO, $Cu_2O$), iron oxide (FeO, $Fe_2O_3$), zinc oxide (ZnO), titanium oxide ($TiO_2$), lithium ruthenate oxide ($Li_2RuO_3$) and a mixture thereof in an embodiment. The inorganic additive comprises a metal oxide powder selected from the group consisting of copper oxide, iron oxide and a mixture thereof in another embodiment. The inorganic additive comprises a metal oxide powder selected from the group consisting of $Cu_2O$, $Fe_2O_3$ and a mixture thereof in another embodiment. The inorganic additive comprises a mixture of a $Cu_2O$ powder and a $Fe_2O_3$ powder in another embodiment. The mixing weight ratio of a $Cu_2O$ powder and a $Fe_2O_3$ powder ($Cu_2O:Fe_2O_3$) is 0.5:1 to 10:1 in an embodiment, 1.1:1 to 8:1 in another embodiment, 1.5:1 to 5:1 in another embodiment, 1.8:1 to 3.5:1 in another embodiment. The inorganic additive comprises at least a $Cu_2O$ powder in another embodiment.

Particle diameter (D50) of the inorganic additive is 0.1 to 10 μm in an embodiment, 0.2 to 5 μm in another embodiment, 0.3 to 3.1 μm in another embodiment, and 0.4 to 1.9

μm in another embodiment. The particle diameter (D50) can be measured by laser diffraction scattering method with Microtrac model S-3500.

The inorganic additive is 0.1 parts by weight or more in an embodiment, 0.3 parts by weight or more in another embodiment, 0.6 parts by weight or more in another embodiment, 0.9 parts by weight or more in another embodiment against 100 parts by weight of the conductive powder. The inorganic additive is 5.0 parts by weight or less in an embodiment, 3.8 parts by weight or less in another embodiment, 2.5 parts by weight or less in another embodiment, 1.8 parts by weight or less in another embodiment against 100 parts by weight of the conductive powder.

The inorganic additive is 0.1 to 5 wt. % in an embodiment, 0.3 to 4.0 wt. % in another embodiment, 0.5 to 2.9 wt. % in another embodiment, 0.8 to 1.8 wt. % in another embodiment based on the weight of the conductive paste.

EXAMPLES

The present invention is illustrated by, but is not limited to, the following examples.

100 parts by weight of the silver powder, 0.5 parts by weight of the glass frit and 1.3 parts by weight of the inorganic additive were dispersed in an organic vehicle in a mixer and homogenized by a three-roll mill. The inorganic additive was a mixture of a $Cu_2O$ powder and a $Fe_2O_3$ powder at mixing weight ratio ($Cu_2O:Fe_2O_3$) of 2.6:1. The particle diameter (D50) of the silver powder was 0.8 μm. The glass frit compositions are shown in Table 1. The organic vehicle was a mixture of 9 wt. % of an organic polymer, 87 wt. % of a solvent and 4 wt. % of organic additives based on the weight of the organic vehicle. The paste viscosity was about 300 Pa·s measured by Brookfield HBT with a spindle #14 at 10 rpm.

The conductive paste was screen printed on $Al_2O_3$ and $(Zr_{0.8}Sn_{0.2})TiO_4$ substrates (25 mm long, 25 mm wide, 0.6 mm thick) in a ring pattern (2.5 mm wide, 10 μm thick, 80 mm round length). Dielectric constant of the substrates were 9 for $Al_2O_3$ and 38 for $(Zr_{0.8}Sn_{0.2})TiO_4$. The electrode was formed by firing the ring pattern at peak temperature of 900° C. for 10 minutes after drying at 150° C. for 10 minutes.

Next, the sheet resistivity (Rs) of the electrode was measured to confirm the electrode had a sufficiently low resistivity. The electrode was newly formed on the same substrate by the same method described above except that the electrode was a line pattern (0.5 mm wide, 100 mm long and 10 μm thick). The resistivity was measured with a digital multimeter (Model 2100, Keithley Instruments, Inc.).

The results were shown in Table 2. The conductive paste comprising the glass frit comprising $SiO_2$, $B_2O_3$, $Al_2O_3$ and the alkaline metal oxide (Example (Ex.) 1 to 11) showed improved Q values on each tested substrate. It's also confirmed that the all electrodes had sufficiently low resistivity of 2.0 mohm/sq or lower.

TABLE 1

| | | | | | Alkaline Metal Oxide | | | | | Additional Metal Oxide | | | | | (wt. %) |
|---|---|---|---|---|---|---|---|---|---|---|---|---|---|---|---|
| Glass # | $SiO_2$ | $B_2O_3$ | $Al_2O_3$ | $Bi_2O_3$ | $Li_2O$ | $Na_2O$ | $K_2O$ | $ZrO_2$ | $TiO_2$ | CaO | ZnO | MgO | CuO | $Fe_2O_3$ | Ts (° C.) |
| A | 70.2 | 24.4 | 1.0 | 0 | 0.5 | 0.5 | 1.0 | 2.4 | 0 | 0 | 0 | 0 | 0 | 0 | 804 |
| B | 69.1 | 24.0 | 1.0 | 0 | 0.5 | 0.5 | 1.0 | 0 | 3.9 | 0 | 0 | 0 | 0 | 0 | 797 |
| C | 66.4 | 23.1 | 0.9 | 0 | 0.5 | 0.5 | 1.0 | 0 | 7.8 | 0 | 0 | 0 | 0 | 0 | 789 |
| D | 70.0 | 24.3 | 1.0 | 0 | 0.5 | 0.5 | 1.0 | 0 | 0 | 2.8 | 0 | 0 | 0 | 0 | 834 |
| E | 69.1 | 24.0 | 1.0 | 0 | 0.5 | 0.5 | 1.0 | 0 | 0 | 0 | 4.0 | 0 | 0 | 0 | 850 |
| F | 66.3 | 23.0 | 0.9 | 0 | 0.5 | 0.5 | 0.9 | 0 | 0 | 0 | 7.9 | 0 | 0 | 0 | 862 |
| G | 70.5 | 24.5 | 1.0 | 0 | 0.5 | 0.5 | 1.0 | 0 | 0 | 0 | 0 | 2.0 | 0 | 0 | 840 |
| H | 69.0 | 24.0 | 1.0 | 0 | 0.5 | 0.5 | 1.0 | 0 | 0 | 0 | 0 | 4.1 | 0 | 0 | 853 |
| I | 69.2 | 24.0 | 1.0 | 0 | 0.5 | 0.5 | 1.0 | 0 | 0 | 0 | 0 | 0 | 3.9 | 0 | 834 |
| J | 69.1 | 24.0 | 1.0 | 0 | 0.5 | 0.5 | 1.0 | 0 | 0 | 0 | 0 | 0 | 0 | 3.9 | 798 |
| K | 72.0 | 25.0 | 1.0 | 0 | 0.5 | 0.5 | 1.0 | 0 | 0 | 0 | 0 | 0 | 0 | 0 | 766 |
| L | 7.1 | 8.4 | 2.1 | 69.8 | 0 | 0 | 0 | 0 | 0 | 0.5 | 12.0 | 0 | 0 | 0 | 524 |

TABLE 2

| | | | | | | | | | | | | (parts by weight) |
|---|---|---|---|---|---|---|---|---|---|---|---|---|
| | Ex. 1 | Ex. 2 | Ex. 3 | Ex. 4 | Ex. 5 | Ex. 6 | Ex. 7 | Ex. 8 | Ex. 9 | Ex. 10 | Ex. 11 | Com. Ex. 1 |
| Silver powder | 100 | 100 | 100 | 100 | 100 | 100 | 100 | 100 | 100 | 100 | 100 | 100 |
| Glass frit | A | B | C | D | E | F | G | H | I | J | K | L |
| | 0.5 | 0.5 | 0.5 | 0.5 | 0.5 | 0.5 | 0.5 | 0.5 | 0.5 | 0.5 | 0.5 | 0.5 |
| Organic vehicle | 19.5 | 19.5 | 19.5 | 19.5 | 19.5 | 19.5 | 19.5 | 19.5 | 19.5 | 19.5 | 19.5 | 19.5 |
| Inorganic additive | 1.3 | 1.3 | 1.3 | 1.3 | 1.3 | 1.3 | 1.3 | 1.3 | 1.3 | 1.3 | 1.3 | 1.3 |
| Rs (mohm/sq.) | 1.8 | 1.8 | 1.9 | 1.9 | 1.8 | 1.9 | 2.0 | 1.9 | 1.9 | 1.8 | 1.9 | 1.8 |
| Q value on $Al_2O_3$ at 2.7 GHz | 2910 | 2898 | 2899 | 2833 | 2914 | 2855 | 2891 | 2870 | 2919 | 2935 | 2880 | 2647 |
| Q value on $(Zr_{0.8}Sn_{0.2})TiO_4$ at 2.6 GHz | 1424 | 1401 | 1414 | 1387 | 1388 | 1365 | 1398 | 1370 | 1415 | 1392 | 1406 | 1312 |

What is claimed is:

1. A method of manufacturing a dielectric filter, comprising the steps of:

(a) preparing a ceramic substrate having a dielectric constant, εy, of 9 to 50 that does not include Aluminum Nitride (AlN);

(b) applying a conductive paste on the ceramic substrate, wherein the conductive paste comprises,
  (i) 100 parts by weight of a conductive powder,
  (ii) 0.1 to 10.0 parts by weight of a glass frit comprising 30 to 85 wt. % of silicon oxide, 11 to 50 wt. % of boron oxide and 0.1 to 5.0 wt. % of aluminum oxide and 0.5 to 6 wt. % of an alkali metal oxide based on the weight of the glass frit, and
  (iii) an organic vehicle; and
(c) firing the applied conductive paste.

2. The method of claim 1, wherein the glass frit further comprises an additional metal oxide selected from the group consisting of zirconium oxide, titanium oxide, calcium oxide, zinc oxide, magnesium oxide, copper oxide, iron oxide and a combination thereof.

3. The method of claim 2, wherein the additional metal oxide is selected from the group consisting of zirconium oxide, titanium oxide, zinc oxide, copper oxide, iron oxide and a combination thereof.

4. The method of claim 2, wherein the additional metal oxide is 0.5 to 20 wt. % based on the weight of the glass frit.

5. The method of claim 1, wherein at least 60 mol % of metal components of the ceramic substrate are selected from the group consisting of Al, Ba, Ca, La, Mg, Mn, Nb, Nd, Ni, Pb, Sm, Sn, Sr, Ta, Ti, Zn, Zr and a mixture thereof.

6. The method of claim 1, wherein the conductive paste is applied on the entire surface of the ceramic substrate.

7. The method of claim 1, wherein the dielectric filter operates in a TEM (transverse electromagnetic) mode.

8. The method of claim 1, wherein a particle diameter ($D_{50}$) of the conductive powder is 0.01 to 10 μm.

9. The method of claim 1, wherein the alkali metal oxide comprises lithium oxide, sodium oxide and potassium oxide.

10. The method of claim 1, wherein the firing temperature in step (c) is 600 to 1100° C.

* * * * *